(12) United States Patent
Bollmann

(10) Patent No.: US 10,516,422 B2
(45) Date of Patent: Dec. 24, 2019

(54) CIRCUIT ARRANGEMENT FOR COMPENSATING FOR A DAMPING OCCURRING IN AN ANTENNA LINE BETWEEN A MOBILE RADIO TERMINAL AND AN ANTENNA

(71) Applicant: Bury Sp.z.o.o., Mielec (PL)

(72) Inventor: Eckhard Bollmann, Huellhorst (DE)

(73) Assignee: BURY SP.Z.O.O., Mielec (PL)

( * ) Notice: Subject to any disclaimer, the term of this patent is extended or adjusted under 35 U.S.C. 154(b) by 565 days.

(21) Appl. No.: 14/141,546

(22) Filed: Dec. 27, 2013

(65) Prior Publication Data

US 2014/0185707 A1    Jul. 3, 2014

(30) Foreign Application Priority Data

Dec. 28, 2012 (DE) .................. 10 2012 113 158

(51) Int. Cl.
*H04B 1/04* (2006.01)

(52) U.S. Cl.
CPC ......... *H04B 1/0475* (2013.01); *H04B 1/0458* (2013.01)

(58) Field of Classification Search
CPC ............... H04B 1/04; H04B 1/38; H04B 7/00
(Continued)

(56) References Cited

U.S. PATENT DOCUMENTS

| 2004/0147230 A1* | 7/2004 | Nast et al. ................. 455/78 |
| 2006/0256754 A1* | 11/2006 | Liu et al. ................. 370/335 |

(Continued)

FOREIGN PATENT DOCUMENTS

| DE | 199 13 064 | 1/2001 |
| EP | 1 371 114 | 5/2005 |

(Continued)

OTHER PUBLICATIONS

Digital cellular telecommunications system (Phase 2+); Physical layer on the radio path; General description (GSM 05.01 version 8.3.0 Release 1999) ETSI TS 100 573 V8.3.0 (Apr. 2000)).*

*Primary Examiner* — Jaison Joseph
(74) *Attorney, Agent, or Firm* — W&C IP

(57) ABSTRACT

A circuit arrangement (1) for compensating for a damping occurring in an antenna line between a mobile radio terminal (2) and an antenna (3), comprising a plurality of partial branches (T1, T2, T3) in each case for assigned transmission services for specific frequency bands, is described. A first partial branch selection switch (S1), on the terminal side at an antenna connection (4) of the circuit arrangement (1), said antenna connection being connectable to the mobile radio terminal (2), is connected to a selected partial branch (T1, T2, T3) depending on the switching position and a second partial branch selection switch (S2), on the antenna side at an antenna connection (5) of the circuit arrangement (1), said antenna connection being connectable to the antenna, is connected to a selected partial branch (T1, T2, T3) depending on the switching position such that a partial branch (T1, T2, T3) selected by the switching position of the partial branch selection switches (S1, S2) is switchable into the signal path between mobile radio terminal (2) and antenna (3). The partial branches (T1, T2, T3) have at least one reception amplifier (EV21, EV22, EV31, EV32, EV33) and/or a transmission amplifier (SV21, SV22, SV31, SV32, SV33). The circuit arrangement (1) has a pulse detection unit (6) for detecting pulse properties of a high-frequency mobile radio signal of a mobile radio terminal (2) that can be connected to the circuit arrangement, and is designed for selecting a partial branch (T1, T2, T3) by driving the first and second partial branch selection switches (S1, S2) depending on the detected pulse properties.

12 Claims, 2 Drawing Sheets

(58) Field of Classification Search
USPC .................................................. 375/219, 295
See application file for complete search history.

(56) References Cited

U.S. PATENT DOCUMENTS

| | | | |
|---|---|---|---|
| 2010/0022243 A1* | 1/2010 | Oommen | H04W 48/18 455/435.3 |
| 2010/0178879 A1* | 7/2010 | Sato et al. | 455/78 |
| 2010/0233975 A1* | 9/2010 | Wu et al. | 455/115.1 |
| 2010/0248660 A1* | 9/2010 | Bavisi et al. | 455/120 |
| 2010/0291915 A1* | 11/2010 | Nast et al. | 455/422.1 |
| 2011/0116422 A1* | 5/2011 | Nast | 370/277 |

FOREIGN PATENT DOCUMENTS

| | | |
|---|---|---|
| EP | 1 841 093 | 2/2007 |
| EP | 2 127 094 | 12/2010 |
| WO | WO 2010/121715 | 10/2010 |

* cited by examiner

CIRCUIT ARRANGEMENT FOR COMPENSATING FOR A DAMPING OCCURRING IN AN ANTENNA LINE BETWEEN A MOBILE RADIO TERMINAL AND AN ANTENNA

FIELD OF THE INVENTION

The invention relates to a circuit arrangement for compensating for a damping occurring in an antenna line between a mobile radio terminal and an antenna, comprising a plurality of partial branches in each case for assigned transmission services on specific frequency bands, wherein a first partial branch selection switch, on the terminal side at an antenna connection of the circuit arrangement, said antenna connection being connectable to the mobile radio terminal, is connected to a selected partial branch depending on the switching position and a second partial branch selection switch, on the antenna side at an antenna line connection of the circuit arrangement, said antenna line connection being connectable to the antenna, is connected to a selected partial branch depending on the switching position such that a partial branch selected by the switching position of the partial branch selection switches is switchable into the signal path between mobile radio terminal and antenna, and wherein the partial branches have at least one reception amplifier and/or a transmission amplifier.

BACKGROUND

When a mobile radio terminal is connected to an external antenna, such as is carried out for example in hands-free telephone devices in motor vehicles, a damping occurs in the signal path from the mobile radio terminal to the antenna, and vice versa. Although the transmission and reception quality is intended to be improved by the external antenna, the damping results in reduction of the signal quality.

A significant damping occurs in particular when the mobile radio terminal is connected to the antenna via an electromagnetic, capacitive or inductive coupler, rather than directly via a radio-frequency cable.

It is therefore known e.g. from DE 199 13 064 C1 for a circuit arrangement for compensating for the signal damping occurring between a mobile radio device and an antenna in a radio-frequency cable to be switched into the antenna signal path. This involves using radio-frequency changeover switches which, in a basic position, conduct the reception signal passing from the antenna to the mobile radio terminal via a reception amplifier. When a transmission signal is detected, a changeover is made to a transmission branch, in order to amplify the transmission signal of a connected mobile radio terminal by means of a transmission amplifier and to output said signal to the antenna. In this time, the reception amplifier is switched off and simultaneous reception is not possible; nor is it necessary in the case of the GSM standard, since the latter involves only ever either transmission or reception being effected alternately.

For operation with the GSM standard at two different frequencies, two frequency branches are provided, which are optimized with regard to the compensation of damping by suitable dimensioning of the components used for the respective frequency band. The antenna signal is split to the respective branch of the frequency band with the aid of a terminal-side and antenna-side frequency band dividing network.

EP 1 371 144 B1 discloses a circuit arrangement for compensating for the damping in an antenna feeder cable for a mobile radio device, which supports both the time-slot-controlled GSM standard and transmissions in the continuous signal method with continuous transmission without division into time slots. For this purpose, on the terminal side and on the antenna side, provision is made of a frequency band dividing network (diplexer) for splitting the antenna signal into two partial branches firstly for the time-slot-controlled transmission services and secondly for the continuous signal transmission services.

EP 2 127 094 B1 describes a modular circuit arrangement for the compensation of damping, which is embodied in a modular fashion and which is formed from an antenna-side universal front-end module, a terminal-side universal back-end module and frequency and/or bandpass filters with detector unit that are adapted to a respective purpose of use of the circuit arrangement.

WO 2010/121715 A1 discloses a device for transmitting and receiving mobile radio signals which supports different transmission standards on different frequency bands. For channel-by-channel conditioning of the transmission signal, separate power amplifiers and duplex filters are provided for the individual channels. The power amplifiers can be driven by means of a controller device such that they can be operated correctly in phase or in a phase-locked manner with respect to one another, in order to synchronize and thereby interconnect a transmission signal amplified in the relevant channels or alternatively, by means of the plurality of duplex filters present, to operate the individual channels separately with different signals.

EP 1 841 083 A2 discloses a circuit arrangement with multiband capability for compensating for the damping of mobile radio transmission and reception signals. In the GSM and CDMA circuit state, only the respective power amplifier provided for amplifying signals having a corresponding frequency is switched on. A transmission signal that can be detected by the detector unit is not fed via a frequency band dividing network, but rather on the basis of an unambiguous switching position of contacts of the switching means, said switching position corresponding to the GSM or CDMA circuit state.

For circuit arrangements having a multiband capability, however, the problem arises that pulse-modulated and continuous-signal-modulated standards are often operated in the same frequency band and a frequency-selective selection of an assigned partial branch by means of switches depending on a detected frequency is then problematic.

SUMMARY

It is an object of the present invention to provide an improved circuit arrangement for compensating for a damping occurring in an antenna line between a mobile radio terminal and an antenna, comprising a plurality of partial branches for respectively assigned transmission services on specific frequency bands.

The object is achieved by means of the circuit arrangement comprising the features of Claim 1. Advantageous embodiments are described in the dependent claims.

It is proposed that the circuit arrangement has a pulse detection unit for detecting pulsed signal properties of a high-frequency transmission signal of a mobile radio terminal that can be connected to the circuit arrangement, and is designed for selecting a partial branch by driving the first and second partial branch selection switches depending on the detected pulsed signal properties.

By means of the detection of pulsed signal properties, in particular of the presence of burst signals for identifying time-slot-controlled transmission methods or for identifying continuous signal transmission methods having a full duplex capability (continuous wave transmission or CDMA/code divisional multiple access methods) in the absence of burst signals, it is possible, by means of the actuation of the partial branch section switches, for the continuous signal transmission standard having a full duplex capability, to feed the antenna signal to one corresponding partial branch and, for time-slot-modulated or pulse-modulated transmission methods, to feed the antenna signal to another partial branch, provided for said methods.

All that is necessary for this purpose is a relatively simple pulse detection unit for detecting pulsed signal properties and, on the terminal side and on the antenna side, in each case a partial branch selection switch in the form of known radio-frequency switches that are driven by the detection unit. In this case, the pulse detection unit is preferably designed for identifying the presence of burst signals.

Preferably, the circuit arrangement has a broadband reception amplifier for amplifying mobile radio signals in a plurality of specific frequency bands supported by the partial branches of the circuit arrangement. Said broadband reception amplifier can be switched into a first partial branch, for example. The circuit arrangement is then designed for selecting the partial branch in a basic position if no transmission signal of a connected mobile radio terminal is detected. Therefore, for reception signals in the basic position, splitting to a specific frequency of the reception signal is not performed, rather a broadband reception amplifier is used in the basic position.

For the case where the transmission power of the mobile radio terminal, in particular of the CDMA signal, is so low that it can no longer be reliably detected, it is recommended to integrate the broadband amplifier into the partial branch for continuous signal transmission services. In the basic position of the partial branch selection switches, the signal path between external antenna and mobile radio terminal is then switched to said broadband reception amplifier in the continuous signal partial branch.

Furthermore, it is advantageous if a partial branch for pulse-modulated transmission services is provided. Such pulse-modulated transmission services can be, for example, time-slot-modulated methods according to the GSM standard. Said partial branch can then be split into a plurality of subbranches for different frequency bands. The partial branch then has frequency-dividing networks for at least two mutually different frequency bands, said frequency-dividing networks being connectable to the first and second partial branch selection switches on the terminal side and on the antenna side. The subbranches in each case for an assigned frequency band each have a transmission amplifier in the transmission path formed by the frequency-dividing networks for associated specific frequency bands. In this way, it is possible to support pulse-modulated transmission methods in different frequency bands in a simple way without additional switches with the aid of frequency-dividing networks.

The reception signal of the pulse-modulated transmission service can then be amplified in the basic position with the aid of a broadband reception amplifier in a separate partial branch.

However, it is also conceivable that a partial branch for pulse-modulated transmission services is provided, which has a plurality of subbranches having in each case on the terminal side and on the antenna side an transmission/reception changeover switch for optionally changing over between a transmission path and a reception path between a terminal-side and antenna-side pair of transmission/reception changeover switches. A transmission amplifier is then switched into a transmission path and a reception amplifier is switched into a reception path of a respective pair of transmission/reception changeover switches. The circuit arrangement is then designed for changeover from the reception path to the transmission path depending on a detected transmission signal, in order, upon detection of the presence of a transmission signal of the mobile radio terminal, to amplify the transmission signal with the aid of a transmission amplifier for this corresponding frequency band in the transmission path. The provision of a transmission path and a reception path between which changeover can be effected with the aid of transmission/reception changeover switches enables fast and low-interference changeover between the transmission amplifier and the reception amplifier directly in the subbranch for the frequency band respectively supported. Furthermore, it is advantageous if a partial branch for transmission services with a continuous signal is provided. Such a partial branch is suitable for the CDMA transmission method, in particular, and is selectable if no pulse pattern characterizing a time slot method, i.e. no burst signal, is detected.

The main branch for continuous signal transmission services is preferably split into a plurality of subbranches. These subbranches have in each case on the terminal side and on the antenna side a duplexer designed for a respective frequency band and, between such a terminal-side and antenna-side pair of duplexers, a transmission amplifier in the transmission path and a reception amplifier in the reception path of the duplexer pair. With the aid of a duplexer, the radio-frequency signal is split into an upper and lower frequency range of the frequency band supported by the duplexer. The upper frequency range is then provided e.g. for the transmission path, and the lower frequency range of the frequency band for the reception path. With the aid of the duplexers, in a manner known per se, it is possible to effect full duplex operation with simultaneous transmission and reception with separate amplification of the transmission signal of the mobile radio terminal by the respective transmission amplifier and of the reception signal—picked up by the external antenna—by the reception amplifier, without the occurrence of significant interference as a result of crosstalk.

It is particularly advantageous if the circuit arrangement has a frequency detector in the signal path for the partial branch for continuous signal transmission services (in particular CDMA transmission methods) in order to detect an active frequency band. In this case, first and second subbranch selection switches are provided in the partial branch for continuous signal transmission services, said switches being driven by the frequency detector depending on the detected frequency of the radio-frequency signal. With the aid of the subbranch selection switches, depending on the detected frequency, it is possible to switch a subbranch assigned for this frequency in the signal path between external antenna and mobile radio terminal. In this case, the subbranches each have a duplexer pair with an interposed transmission and reception amplifier in the manner described above. The first subbranch selection switch is then connected to a switching output of the first, terminal-side partial branch selection switch and the second subbranch selection switch is connected to a switching output of the second, antenna-side partial branch selection switch. The first and second subbranch selection switches are then optionally connectable to a subbranch by virtue of their switching position.

Preferably the Global System for Mobile Communications standard (GSM) is supported as pulse-modulated transmission service in an assigned partial branch. Said GSM partial branch is then selectable upon detection of a burst signal.

Preferably the Universal Mobile Telecommunications System standard (UMTS) and/or the Long Term Evolution standard (LTE) and possible further suitable CDMA standards are/is supported as continuous signal transmission services according to the CDMA standard in respective subbranches of an assigned continuous signal partial branch for transmission services with a continuous signal.

It is conceivable that as an alternative or in addition to the selection of a GSM partial branch and of a CDMA partial branch depending on pulse properties of the radio-frequency signal, provision is made of other partial branches for other transmission standards which are characterized by detectable pulsed signal properties.

The splitting depending on the respective frequency bands is effected only afterward in the partial branches selected by pulse detection, either with the aid of frequency-dividing networks or by means of frequency detection.

DESCRIPTION OF THE DRAWINGS

The invention is explained in greater detail below on the basis of exemplary embodiments with the accompanying drawings, in which.

DETAILED DESCRIPTION

Figure 1:
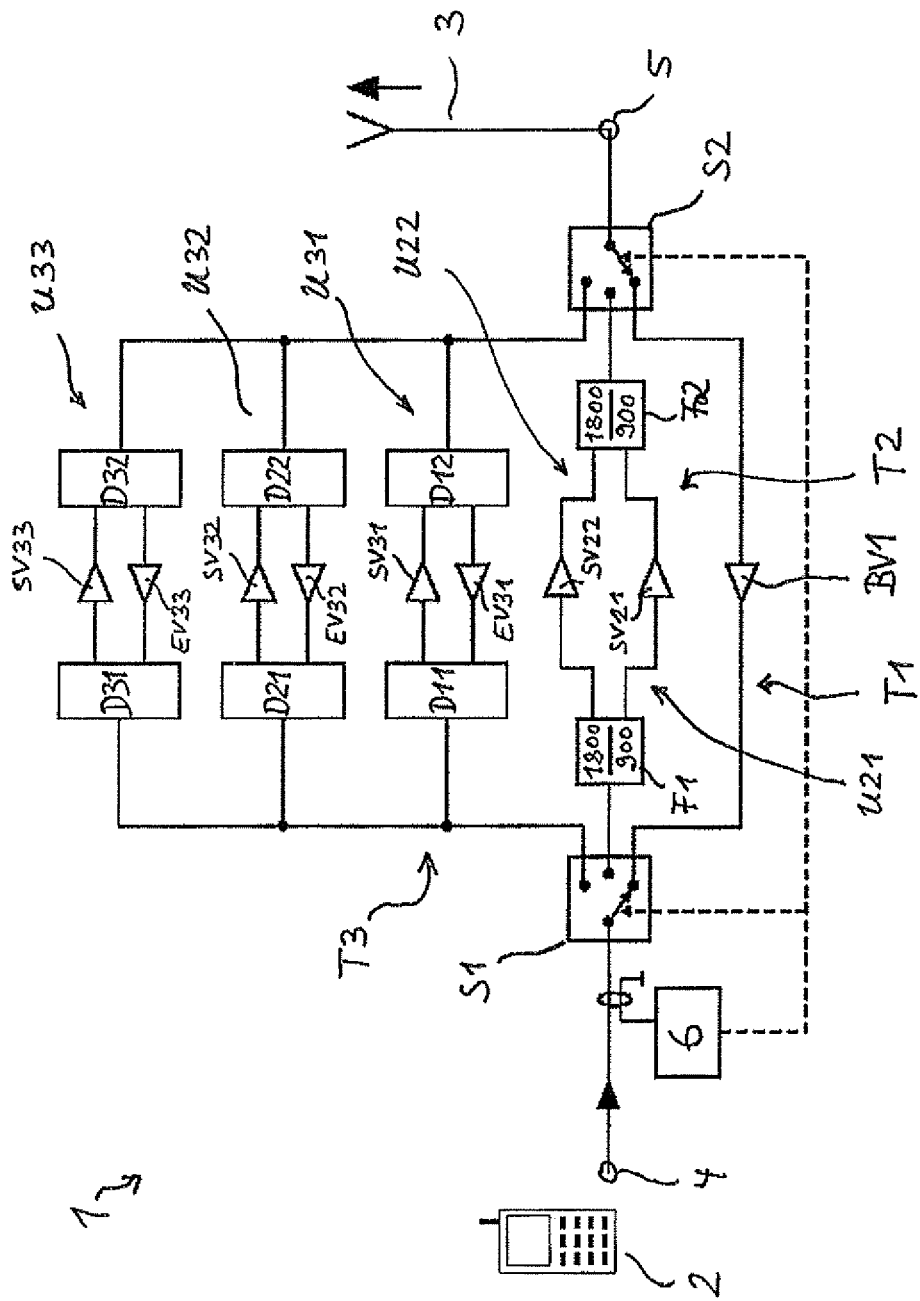
FIG. 1 shows a block diagram of a first embodiment of a circuit arrangement for compensating for damping.

FIG. 1 reveals a first embodiment of a circuit arrangement 1 for compensating for a damping occurring in an antenna line between a mobile radio terminal 2 and an antenna 3. The circuit arrangement has a first partial branch T1 having a broadband reception amplifier BV1 for amplifying reception signals which are picked up by the antenna 3 and conducted to the mobile radio terminal 2. In this case, the broadband reception amplifier BV1 is designed to amplify reception signals in a plurality of frequency bands supported by the circuit arrangement 1. The broadband reception amplifier BV1 is therefore not frequency-selective. It is preferably usable in a frequency range of at least 800 MHz to 2100 MHz, in order to be able to equally amplify reception signals of different mobile radio standards e.g. in the frequency bands 800 MHz, 900 MHz, 1800 MHz and 2100 MHz.

A second partial branch T2 for pulse-modulated transmission services is furthermore provided. Time-slot-controlled transmission methods, in particular, are involved here, in which specific pulsed signal properties in particular in the form of burst effects occur in the associated radio-frequency signals. In these pulse-modulated transmission methods, transmission and reception are effected at the same frequency, such that transmission and reception are effected alternately and in a time-offset manner. Such pulse-modulated transmission methods can involve, for example, the GSM standard (Global System for Mobile Communication).

A third partial branch T3 is provided for continuous signal transmission services which operate with a full duplex capability in the continuous wave mode. In these continuous signal transmission methods, the transmission signal has other pulsed signal properties in such a way that no burst effects occur.

A terminal-side partial branch selection switch S1 and an antenna-side partial branch selection switch S2 are provided for changing over the signal path between mobile radio terminal 2 and antenna 3 in a selected partial branch T1, T2, T3. The terminal-side partial branch selection switch S1 is connectable to at least one mobile radio terminal 2 on the terminal connection side of the circuit arrangement. The terminal-side partial branch selection switch S1 is thus connected to the antenna connection 4 for a mobile radio terminal 2 in the circuit arrangement 1. If appropriate, an electromagnetic, inductive or capacitive coupler for coupling a mobile radio terminal 2 can also be connected to said antenna connection 4. The mobile radio terminal 2 is thus connected to the circuit arrangement 1 either directly or indirectly.

Depending on the switching position of the terminal-side partial branch selection switch S1 the mobile radio terminal 2 is then connected to the respective partial branch T1, T2 or T3.

The antenna-side partial branch selection switch S2 is connectable to the external antenna 3 and for this purpose is connected to an antenna connection 5 of the circuit arrangement 1. Depending on the switching position, said antenna connection 5 or an external antenna 3 connected thereto is connectable to the selected partial branch T1, T2 or T3.

In a basic position, the first and second partial branch selection switches S1, S2 are driven such that the first partial branch T1 having the broadband reception amplifier BV1 is switched in the signal path between mobile radio terminal 2 and external antenna 3.

A pulse detection unit 6 is switched into the signal path between mobile radio terminal 2 and terminal-side partial branch selection switch S1, said pulse detection unit 6 being designed for detecting pulse properties of the radio-frequency signal in this signal path between mobile radio terminal 2 and first partial branch selection switch S1.

Upon detection of burst signals in the transmission signal of the mobile radio terminal 2, the pulse detection unit 6 identifies the fact that the mobile radio terminal 2 transmits in the pulse-modulated transmission method, in particular in the time-slot-controlled GSM transmission method. By means of corresponding driving of the first and second partial branch selection switches S1, S2, a changeover is then made to the second partial branch T2, in order to amplify the GSM transmission signal. When a transmission signal fails to appear, the system switches back again to the broadband reception amplifier 4 in the first partial branch T1. Since transmission and reception are effected in a time-offset manner in the GSM transmission method, continual switching back and forth between the first partial branch T1 and the second partial branch T2 thus takes place during a bidirectional communication between mobile radio terminal 2 and a base station via the antenna 3.

The second partial branch T2 is split into subbranches U21 and U22 in order to support the GSM transmission method in two different frequency bands. These can be, for example, the frequency bands 900 MHz and 1800 MHz. For this purpose, the transmission signal is conducted through a first terminal-side frequency-dividing network F1, which, depending on the frequency of the transmission signal, leads into the first subbranch U21 for the frequency band GSM 900 MHz or into the second subbranch U22 for the frequency band GSM 1800 MHz. In the respective subbranch, a transmission amplifier SV21, SV22, SV31, SV32, SV33 adapted to the corresponding frequency is then switched.

Said transmission amplifier is designed for amplifying the transmission signal in the associated frequency band. The output of the respective transmission amplifier SV21, SV22, SV31, SV32, SV33 is led to a second frequency-dividing network F2, the common output of which is connected to the second partial branch selection switch S2.

The third partial branch T3 is also split into a plurality of subbranches U31, U32, U33 for different frequency bands (e.g. LTE 800 MHz, LTE 1800 MHz, UMTS 2100 MHz). Since the third partial branch T3 is provided for continuous signal transmission methods with full duplex capability, each subbranch U31, U32, U33 respectively has a reception amplifier EV31, EV32, EV33 and a transmission amplifier SV31, SV32, SV33. The subbranches U31, U32, U33 have on the terminal-side and on the receiver side in each case a terminal-side duplexer D11, D21, D31 and, on the opposite side, an antenna-side duplexer D12, D22, D32. With the aid of these duplexers D11, D12, D21, D22, D31, D32, the respective signal in the frequency band is split between an upper and lower band in the frequency band for a reception path and a transmission path. Specifically, the simultaneous transmission and reception in a frequency band are effected by the predefined splitting of the transmission and reception signals in the frequency band between an upper and lower frequency in the frequency band. The reception amplifiers EV31, EV32, EV33 are thus switched into the reception path between the respective duplexers D11, D12, D21, D22, D31, D32 in the respective subbranch U31, U32, U33. Correspondingly, the transmission amplifiers SV31, SV32, SV33 are switched into the respective transmission path between the associated duplexer pair D11, D12; D21, D22; D31, D32.

In this embodiment illustrated, the circuit arrangement 1 thus consists of three partial branches T1, T2, T3. The first partial branch T1 forms a broadband reception branch, the second partial branch T2 forms a GSM transmission branch and the third partial branch T3 forms a CDMA partial branch for supporting the COMA-based transmission standard having a full duplex capability (Code Division Multiple Access). The second and third partial branches T2 and T3 are split into subbranches U21, U22, U31, U32, U33 for the different frequencies. Via two radio-frequency partial branch selection switches S1, S2, the signal is respectively switched to one of the three partial branches T1, T2, T3. Said partial branch selection switches S1, S2 are driven by the pulse detection unit 6, which identifies on the basis of burst signals whether either no transmission signal of the mobile radio terminal 2, a GSM-typical burst signal or a COMA-typical continuous signal is present.

In the absence of a transmission signal, both partial branch selection switches S1, S2 are in the basic position, as illustrated in FIG. 1, in which the first partial branch T1 is switched into the signal path between mobile radio terminal 2 and external antenna 3. In this case, only the reception signal is passed from the external antenna 3 via a broadband reception amplifier BV1 to the mobile radio terminal 2.

If a GSM-typical transmission signal of a connected mobile radio terminal 2 is identified, then the pulsed signal detection unit switches the partial branch selection switches S1, S2 into the middle position, in which the transmission signal is passed via the GSM transmission branch, i.e. the second partial branch T2. Depending on the frequency of the GSM transmission signal, the latter is passed via the frequency-dividing networks F1, F2 either via the first transmission amplifier SV21 or the second transmission amplifier SV22. However, the second partial branch S2 is switched into the signal path by the corresponding driving of the partial branch selection switches S1, S2 only as long as a transmission signal is present. In the case of the GSM transmission method, this takes place e.g. for a duration of approximately 577 µs for one time slot. In the transmission pauses (e.g. 4.038 ms), the partial branch selection switches S1, S2 are brought to the basic position again, in order to switch the broadband reception amplifier BV1 into the signal path again and to switch the reception signal from the external antenna through to the mobile radio terminal 2 again.

If a continuous transmission signal is detected, such as is typical e.g. in a CDMA transmission method, then the two partial branch selection switches S1, S2 are brought to the upper position for selection of the third partial branch T3. Depending on the frequency of the transmission/reception signal, one of the three duplexers D11, D21, D31 is in the passband and passes the transmission signal to the transmission amplifier SV31, SV32, SV33 intended for this frequency. Via the downstream duplexer D12, D22, D32, the amplified transmission signal is passed to the second partial branch selection switch S1 and on to the external antenna 3. For the reception signal from the external antenna 3, correspondingly one of the three duplexers D12, D22, D32 is in the passband and passes the reception signal to the reception amplifier EV31, EV32, EV33 intended for this frequency. Via the downstream duplexers D11, D21, D31, the amplified reception signal is then passed to the first partial branch selection switch S1 and from there on to the mobile radio terminal 2.

The exemplary embodiment from FIG. 1 can be modified under certain circumstances to the effect that only the two partial branches T2 and T3 for pulse-modulated transmission methods and for continuous signal transmission services (COMA) are provided. The reception amplifier BV1 is then integrated into one of the partial branches T2, T3, preferably into the partial branch T3 for continuous signal transmission services. In the basic position of the partial branch selection switches, the signal path between external antenna and mobile radio terminal is then switched to said reception amplifier BV1, preferably in the continuous signal partial branch. In this case, the subbranch having the reception amplifier BV1 is preferably designed for a frequency of 900 MHz, wherein in a manner comparable to the duplexers in the partial branch T3 corresponding filters can be switched upstream and downstream of the reception amplifier BV1. In this case, the reception amplifier need not necessarily be broadband, since in the partial branch T3 for continuous signal transmission services apart from the frequency band of 900 MHz all other frequency bands are supported and the associated signals are amplified, without a signal detection of a possibly weak CDMA signal having to take place in the basic position. This modification is appropriate for the case where the transmission power of the mobile radio terminal, in particular of the CDMA signal, is so low that it can no longer be reliably detected.

Figure 2:
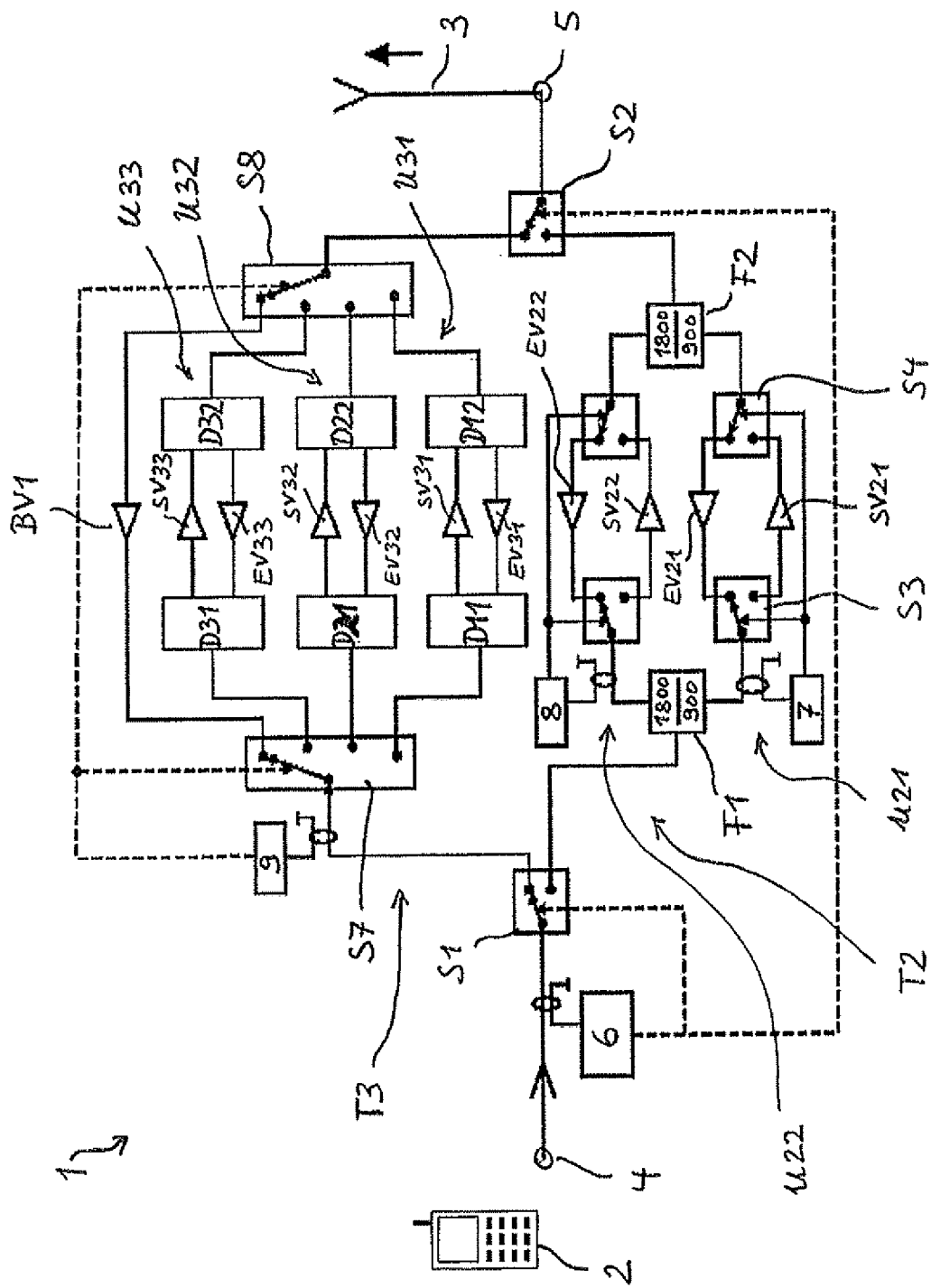
FIG. 2 shows a block diagram of a second embodiment of a circuit arrangement for compensating for damping.

FIG. 2 reveals a second embodiment of a circuit arrangement 1 for compensating for damping, comprising a GSM partial branch T2 and a CDMA partial branch T3. A terminal-side partial branch selection switch S1 and an antenna-side partial branch selection switch S2 are once again provided, in order optionally to switch either the GSM partial branch T2 or the CDMA partial branch T3 into the signal path between mobile radio terminal 2 and external antenna 3. The two partial branch selection switches S1 and S2 are once again drivable by a pulse detection unit 6 depending on detected pulse properties. In particular, the partial branch switches S1 and S2, for selecting the GSM partial branch T2, are brought to the lower position if a GSM-typical burst signal is identified as transmission and/or reception signal. Otherwise, the system switches to the upper, illustrated basic position for the CDMA partial branch T3.

The GSM partial branch T2 once again has two subbranches U21, U22 for supporting the two frequency bands 900 MHz and 1800 MHz. As in the exemplary embodiment described above, each subbranch U21, U22 is switched at a terminal-side and antenna-side frequency-dividing network F1, F2.

Each subbranch U21, U22 has a transmission signal detector 7, 8, which detects the presence of a transmission signal relevant to the respective frequency. Furthermore, each subbranch U21, U22 respectively has a pair of radio-frequency switches S3, S4; S5, S6 in order to switch in a basic position as illustrated either in a reception path or in a changeover position upon detection of the presence of a transmission signal in a transmission path. A respective reception amplifier EV21, EV22 is switched in the reception path of the subbranches U21, U22 and a transmission amplifier SV21, SV22 is correspondingly switched in the transmission path, in order optionally to amplify either the reception signal of the respective frequency or the transmission signal in the respective frequency.

A pair of subbranch selection switches S7, S8 is likewise provided here in the CDMA partial branch T3, said switches being switched to a broadband reception amplifier BV1 in a basic position as depicted schematically, in order to switch the broadband reception amplifier BV1 into the signal path between external antenna 3 and mobile radio terminal 2.

Furthermore, a frequency detector 9 is present between the subbranch selection switch S7 and the first partial branch selection switch S1 for the purpose of detecting the transmission frequency of the mobile radio terminal 2 in the CDMA partial branch T3. Upon identification of a transmission signal, the subbranch selection switches S7, S8 are respectively switched into a subbranch U31, U32, U33 provided for the frequency band detected here. As in the exemplary embodiment described above (cf. FIG. 1), the subbranches U31, U32, U33 respectively have a duplexer pair D11, D12; D21, D22 and D31, D32 having interposed transmission and reception amplifiers EV31, SV31; EV32, SV32, EV33, SV33.

In the basic position depicted schematically, which is assumed in the absence of a transmission signal of the mobile radio terminal 2, the radio-frequency signals received by the external antenna 3 pass via the second partial branch selection switch S2 via the CDMA subbranch selection switch S8 to the broadband reception amplifier BV1 and having been amplified are conducted from there via the CDMA subbranch selection switch S8 of the CDMA partial branch T3 and the first partial branch selection switch S1 to the mobile radio terminal 2.

When a transmission signal of the mobile radio terminal 2 is present, firstly the fact of whether a GSM signal or a CDMA signal is involved is detected with the aid of the pulse detection unit 6. Criteria here include the pulse properties of the transmission signal and, in particular, whether a pulsed signal having a GSM-typical period duration or a continuous signal is involved, independently of the frequency. Upon identification of a GSM signal, for example on the basis of burst effects, the transmission signal is changed over to the GSM partial branch T2. Upon identification of a CDMA signal, a changeover is correspondingly made to the CDMA partial branch T3.

In the GSM partial branch T2, the transmission signal passes firstly via a frequency-dividing network F1 into the subbranch U21, U22 relevant to this frequency. A respective transmission signal detector 7, 8 is situated within the individual subbranches and detects a transmission signal relevant to this frequency. When the transmission signal is present, the assigned radio-frequency switch pairs S3, S4 and respectively S5, S6 are switched to the lower position and the transmission signal is amplified by use of the amplifier SV21, SV22 provided for the corresponding frequency. The amplified transmission signal then passes via the second frequency-dividing network F2 and the second partial branch selection switch S2 to the external antenna 3.

In the transmission pause, no signal is detected by the transmission signal detector 7, 8 and the assigned radio-frequency switch pairs S3, S4 and respectively S5, S6 are switched back to the basic position. As a result, the respective reception amplifiers EV21, EV22 in the present reception path are switched into the signal path between external antenna and mobile radio terminal 2. The GSM signal received by the external antenna 3 is thus amplified by the assigned reception amplifier EV21 or EV22 depending on the respective frequency and is passed via the frequency-dividing network F1 and the first partial branch selection switch S1 to the mobile radio terminal 2.

A transmission signal detector 9 is likewise provided in the CDMA partial branch T3 and detects the transmission frequency of the mobile radio terminal 2 in the transmission signal and drives the subbranch selection switch pair S7, S8 depending on this. An assigned subbranch U31, U32, U33 is thereby selected depending on the detected frequency. In the respective subbranch, the CDMA transmission signal of the mobile radio terminal 2 passes via the first partial branch selection switch S1 and the subbranch selection switch S7 via a duplexer D11, D21, D31, selected depending on the frequency, to the associated transmission amplifier SV31, SV32, SV33. The amplified transmission signal passes via the assigned duplexer D12, D22, D32 and the subbranch selection switch S8 and the second partial branch selection switch S2 to the external antenna. In full duplex operation, the reception signal is passed from the external antenna 3 simultaneously via the second partial branch selection switch S2 and the subbranch selection switch S8 to the subbranch U31, U32, U33 selected depending on frequency. There the reception signal is passed by the assigned duplexer D12, D22, D32 to the respective reception amplifier EV31, EV32, EV33 and from there as an amplified reception signal via the assigned duplexer D11, D21, D31 and the subbranch selection switch S7 and the first partial branch selection switch S1 to the mobile radio terminal 2.

The invention claimed is:

1. Circuit arrangement for compensating for a damping occurring in an antenna line between a mobile radio terminal and an antenna, comprising:
   a plurality of partial branches in each case for assigned transmission services on specific frequency bands;
   an antenna connection connectable to the mobile radio terminal;
   a first partial branch selection switch on a terminal side of the antenna connection that is connected to a selected partial branch of said plurality of partial branches depending on a switching position of the first partial branch selection switch;
   a second partial branch selection switch on an antenna side of the antenna connection that is connected to a selected partial branch of said plurality of partial branches depending on a switching position of the second partial branch selection switch,
   wherein the partial branch selected by the switching position of the first and second partial branch selection switches is switchable into the signal path between mobile radio terminal and antenna, and wherein each of the partial branches have at least one reception amplifier and/or a transmission amplifier; and a pulse detection unit for detecting pulse properties including the existence of burst signals of a high-frequency transmission signal of a mobile radio terminal, wherein the pulse detection unit is configured for selecting a partial branch by driving the first and second partial branch selection switches depending on detected pulsed signal properties, wherein at least one partial branch of the plurality of partial branches provides for transmission services with a continuous signal, wherein said at least one partial branch is selectable if no burst signal is detected.

2. The circuit arrangement according to claim 1, wherein one of the at least one reception amplifier is a broadband reception amplifier positioned in a first partial branch for amplifying mobile radio signals in a plurality of specific frequency bands supported by the plurality of partial branches, and wherein the circuit arrangement is configured to select the first partial branch in a basic position if no transmission signal of a connected mobile radio terminal is detected.

3. The circuit arrangement according to claim 1, wherein one of the at least one reception amplifier is a broadband reception amplifier in a partial branch for continuous signal transmission services, wherein the broadband reception amplifier amplifies mobile radio signals in a plurality of specific frequency bands supported by the plurality of partial branches, and wherein the circuit arrangement is configured to select the continuous signal partial branch in a basic position if no transmission signal of a connected mobile radio terminal is detected.

4. The circuit arrangement according to claim 1, wherein at least one partial branch of the plurality of partial branches provides for pulse-modulated transmission services, wherein said at least one partial branch has a plurality of subbranches, and frequency-dividing networks for at least two mutually different frequency bands, said frequency-dividing networks being connectable to the first and second partial branch selection switches on the terminal side and on the antenna side, and wherein the plurality of subbranches each have a respective transmission amplifier in the transmission path formed by the frequency-dividing networks for associated specific frequency bands.

5. The circuit arrangement according to claim 1, wherein at least one partial branch of the plurality of partial branches provides for pulse-modulated transmission services, wherein the at least one partial branch has a plurality of subbranches having in each case on the terminal side and on the antenna side a transmission/reception changeover switch for optionally changing over between a transmission path and a reception path between a terminal-side and antenna-side pair of transmission/reception changeover switches, wherein a transmission amplifier is provided in a transmission path and a reception amplifier is provided in a reception path of a respective pair of transmission/reception changeover switches, and wherein the circuit arrangement is configured for changeover from the reception path to the transmission path depending on a detected transmission signal, in order, upon detection of a transmission signal, to amplify the transmission signal.

6. The circuit arrangement according to claim 1, wherein the at least one partial branch for continuous signal transmission services has a plurality of subbranches having in each case on the terminal side and on the antenna side a duplexer pair including a terminal-side duplexer and an antenna-side duplexer for a respective frequency band and, between the terminal-side duplexer and the antenna-side duplexer, a transmission amplifier in a transmission path and a reception amplifier in a reception path of the duplexer pair.

7. The circuit arrangement according to claim 1, further comprising:

a frequency detector in the signal path for the at least one partial branch for continuous signal transmission services for detecting an active frequency band; and first and second subbranch selection switches drivable depending on an active frequency band detected by the frequency detector, wherein the first subbranch selection switch is connected to a switching output of the first partial branch selection switch and the second subbranch selection switch is connected to a switching output of the second partial branch selection switch, and wherein the first and second subbranch selection switches are optionally connectable to a subbranch.

8. The circuit arrangement according to claim 1, wherein at least one partial branch of the plurality of partial branches provides for the Global System for Mobile Communications standard (GSM) as a pulse-modulated transmission service, wherein said at least one partial branch is selectable upon detection of a burst signal.

9. The circuit arrangement according to claim 1, wherein at least one partial branch of the plurality of partial branches provides for the Universal Mobile Telecommunications System standard (UMTS) and/or the Long Term Evolution standard (LTE) as a continuous signal transmission service.

10. The circuit arrangement according to claim 1 wherein at least one of the partial branches is configured for continuous signal transmission service, and at least another of the partial branches is configured for pulse-modulated transmission service.

11. The circuit arrangement according to claim 10 wherein the at least one of the partial branches configured for continuous signal transmission service comprises at least one set of reception amplifiers and transmission amplifiers.

12. The circuit arrangement according to claim 1, wherein the pulse detection unit is arranged in the signal path between the mobile radio terminal and the plurality of partial branches.

* * * * *